United States Patent
Yang

(10) Patent No.: US 9,772,143 B2
(45) Date of Patent: Sep. 26, 2017

(54) THERMAL MODULE

(71) Applicant: ASIA VITAL COMPONENTS CO., LTD., Sinjhuang District, New Taipei (TW)

(72) Inventor: Hsiu-Wei Yang, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 164 days.

(21) Appl. No.: 13/869,971

(22) Filed: Apr. 25, 2013

(65) Prior Publication Data
US 2014/0318744 A1   Oct. 30, 2014

(51) Int. Cl.
| | |
|---|---|
| *F28D 15/00* | (2006.01) |
| *F28D 15/04* | (2006.01) |
| *F28D 15/02* | (2006.01) |
| *F28F 1/32* | (2006.01) |
| *H01L 23/427* | (2006.01) |
| *H01L 23/367* | (2006.01) |
| *H01L 23/467* | (2006.01) |

(52) U.S. Cl.
CPC ....... *F28D 15/046* (2013.01); *F28D 15/0275* (2013.01); *F28F 1/32* (2013.01); *H01L 23/427* (2013.01); *H01L 23/3672* (2013.01); *H01L 23/467* (2013.01); *H01L 2924/0002* (2013.01)

(58) Field of Classification Search
CPC  F28F 13/08; F28F 13/12; F28D 15/00; F28D 15/0266; F28D 15/04; F28D 15/046; H05K 7/20
USPC ............... 165/104.266, 104.32, 104.33, 122, 165/104.26, 104.14; 361/700
See application file for complete search history.

(56) References Cited

U.S. PATENT DOCUMENTS

| | | | | |
|---|---|---|---|---|
| 5,647,430 A | * | 7/1997 | Tajima | ............... F28D 15/0266 165/104.21 |
| 5,699,853 A | * | 12/1997 | Goth | .................... H01L 23/427 165/104.21 |
| 6,283,201 B1 | * | 9/2001 | Lee et al. | ..................... 165/185 |
| 6,714,413 B1 | * | 3/2004 | Ghosh | ................ F28D 15/0266 165/104.21 |

(Continued)

FOREIGN PATENT DOCUMENTS

| | | |
|---|---|---|
| CN | 1707783 A | 12/2005 |
| CN | 1988787 A | 6/2007 |

(Continued)

*Primary Examiner* — Len Tran
*Assistant Examiner* — Gustavo Hincapie Serna
(74) *Attorney, Agent, or Firm* — C. G. Mersereau; Nikolai & Mersereau, P.A.

(57) ABSTRACT

A thermal module includes a first heat transfer member and a second heat transfer member. The first heat transfer member has a first chamber in which a first capillary structure is disposed. The second heat transfer member has a second chamber and a conduction section. A second capillary structure is disposed in the second chamber. The conduction section is received in the first chamber. A third capillary structure is disposed on outer surface of the conduction section. A working fluid is respectively filled in the first and second chambers. The third capillary structure is disposed on the outer surface of the conduction section to enhance the heat transfer effect of the second heat transfer member so as to enhance the heat transfer efficiency of the entire thermal module.

8 Claims, 9 Drawing Sheets

(56) References Cited

U.S. PATENT DOCUMENTS

| | | | |
|---|---|---|---|
| 6,834,713 B2* | 12/2004 | Ghosh | F28D 15/0266 |
| | | | 165/104.21 |
| 6,958,912 B2* | 10/2005 | Pokharna et al. | 361/700 |
| 7,661,463 B2* | 2/2010 | Liu | H01L 23/427 |
| | | | 165/104.14 |
| 7,987,898 B2* | 8/2011 | Meng et al. | 165/80.3 |
| 2003/0103330 A1* | 6/2003 | Luo | G06F 1/20 |
| | | | 361/697 |
| 2005/0178532 A1* | 8/2005 | Meng-Cheng et al. | 165/104.33 |
| 2007/0240852 A1* | 10/2007 | Liu | F28D 15/0275 |
| | | | 165/104.14 |
| 2008/0251239 A1* | 10/2008 | Mochizuki | 165/104.33 |
| 2009/0109623 A1* | 4/2009 | Jang et al. | 361/700 |
| 2009/0195984 A1* | 8/2009 | Meyer et al. | 361/700 |
| 2010/0006267 A1* | 1/2010 | Meyer, IV | F28D 15/0233 |
| | | | 165/104.26 |
| 2010/0006268 A1* | 1/2010 | Meyer et al. | 165/104.26 |
| 2011/0017431 A1* | 1/2011 | Yang et al. | 165/104.26 |
| 2011/0146955 A1* | 6/2011 | Chen | 165/104.26 |
| 2011/0186268 A1* | 8/2011 | Yang | F28D 15/02 |
| | | | 165/104.26 |
| 2011/0220328 A1* | 9/2011 | Huang | F28D 15/0241 |
| | | | 165/104.26 |
| 2011/0290450 A1* | 12/2011 | Wu | 165/104.26 |
| 2011/0297355 A1* | 12/2011 | Meyer, IV | F28D 15/0233 |
| | | | 165/104.26 |
| 2012/0002373 A1* | 1/2012 | Kitajima et al. | 361/717 |
| 2012/0075805 A1* | 3/2012 | Cheng | H01L 23/427 |
| | | | 361/700 |
| 2012/0227935 A1* | 9/2012 | Huang | B21D 39/04 |
| | | | 165/104.26 |
| 2014/0060781 A1* | 3/2014 | Jia | F28D 15/04 |
| | | | 165/104.26 |

FOREIGN PATENT DOCUMENTS

| | | |
|---|---|---|
| TW | M252255 U | 12/2004 |
| TW | M286564 U | 1/2006 |
| TW | I251656 B | 3/2006 |
| TW | I292691 B | 1/2008 |
| TW | M402591 U1 | 4/2011 |
| TW | I394031 B1 | 4/2013 |

* cited by examiner

THERMAL MODULE

BACKGROUND OF THE INVENTION

1. Field of the Invention

The present invention relates generally to a thermal module, and more particularly to a thermal module having both a large-area heat transfer effect and a remote end heat transfer effect.

2. Description of the Related Art

There is a trend to develop thinner and thinner electronic apparatuses nowadays. The ultra-thin electronic apparatus includes miniaturized components. The heat generated by the miniaturized components of the electronic apparatus has become a major obstacle to having better performance of the electronic apparatus and system. Even if the semiconductors forming the electronic component have been more and more miniaturized, the electronic apparatus is still required to have high performance.

The miniaturization of the semiconductors will lead to increase of thermal flux. The challenge to cooling the product due to increase of thermal flux exceeds the challenge simply caused by increase of total heat. This is because the increase of thermal flux will lead to overheating at different times with respect to different sizes and may cause malfunction or even burnout of the electronic apparatus.

In order to solve the problem of narrow heat dissipation space of the conventional technique, a vapor chamber (VC) is generally positioned on the chip as a heat dissipation device (structure). In order to increase the capillarity limit of the vapor chamber, capillary structures with voids, such as copper posts, sintered coatings, sintered posts and foamed posts, are disposed in the vapor chamber as support structures and backflow passages. The micro-vapor chamber has very thin upper and lower walls (thickness under 1.5 mm). The support structures are connected between the upper and lower walls to avoid thermal expansion and malfunction.

The conventional vapor chamber serves to face-to-face uniformly transfer heat. Generally, the heat is uniformly transferred from a heat absorption face in contact with a heat source to a condensation face opposite to the heat absorption face. The vapor chamber is advantageous in that it has larger heat transfer area and is able to quickly and uniformly transfer the heat. However, the vapor chamber has a critical shortcoming that it can hardly transfer the heat to a remote end to dissipate the heat. In the case that the heat is not dissipated in time, the heat will accumulate around the heat source.

There is a conventional heat dissipation structure composed of heat pipe and vapor chamber. The outer sides of the heat pipe and the vapor chamber are welded with each other. The welding sections may cause thermal resistance. Moreover, the working fluid is filled in the vapor chamber to perform vapor-liquid circulation between the evaporation section and the condensation section. The heat is first transferred through the vapor chamber and then to the heat pipe welded with the vapor chamber. Therefore, the heat transfer effect is limited.

SUMMARY OF THE INVENTION

It is therefore a primary object of the present invention to provide a thermal module with higher heat dissipation efficiency.

To achieve the above and other objects, the thermal module of the present invention includes a first heat transfer member and a second heat transfer member. The first heat transfer member has a first chamber in which a first capillary structure is disposed. The second heat transfer member has a second chamber and a conduction section. A second capillary structure is disposed in the second chamber. The conduction section is received in the first chamber. A third capillary structure is disposed on outer surface of the conduction section. A working fluid is respectively filled in the first and second chambers.

The thermal module of the present invention not only has a large-area heat transfer effect, but also has a remote end heat transfer effect. The third capillary structure is disposed on the outer surface of the conduction section to greatly enhance the heat transfer efficiency of the entire thermal module.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
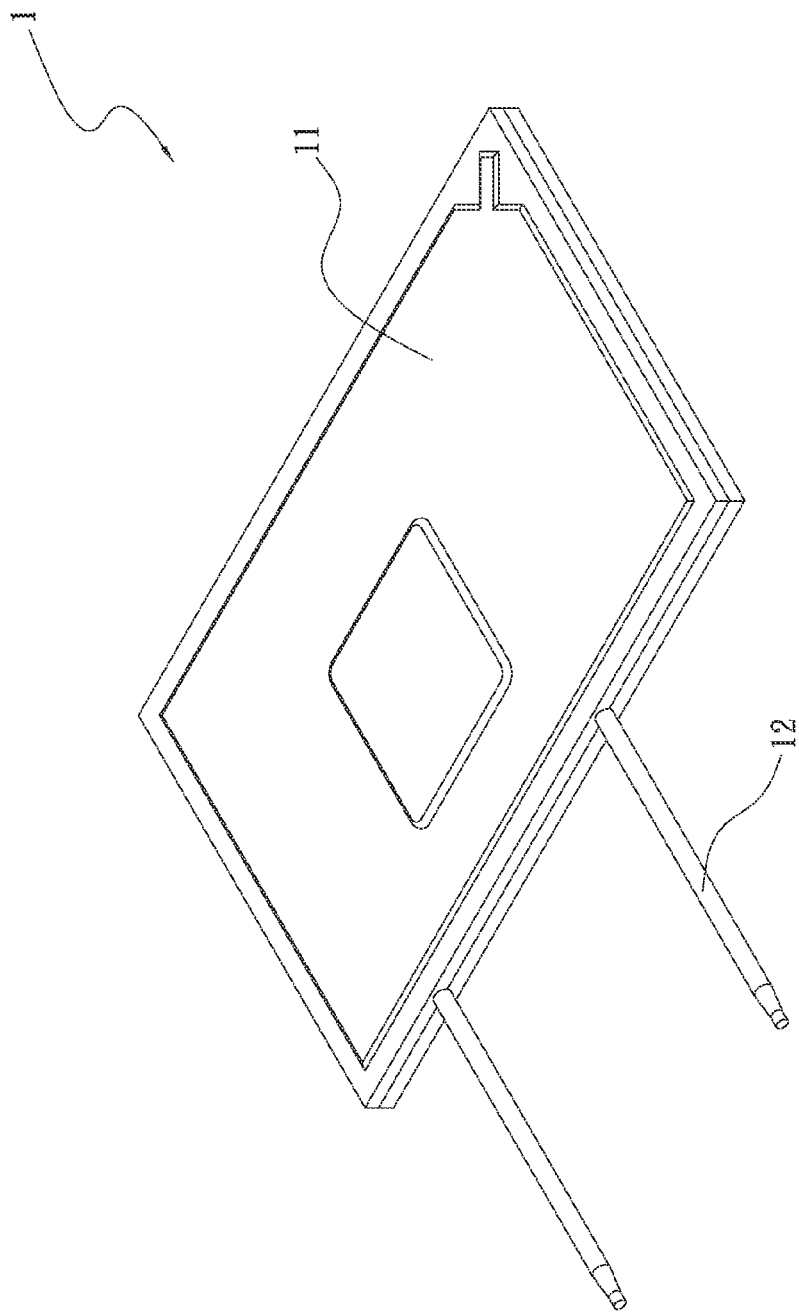
FIG. 1 is a perspective view of a first embodiment of the thermal module of the present invention.
Figure 2:
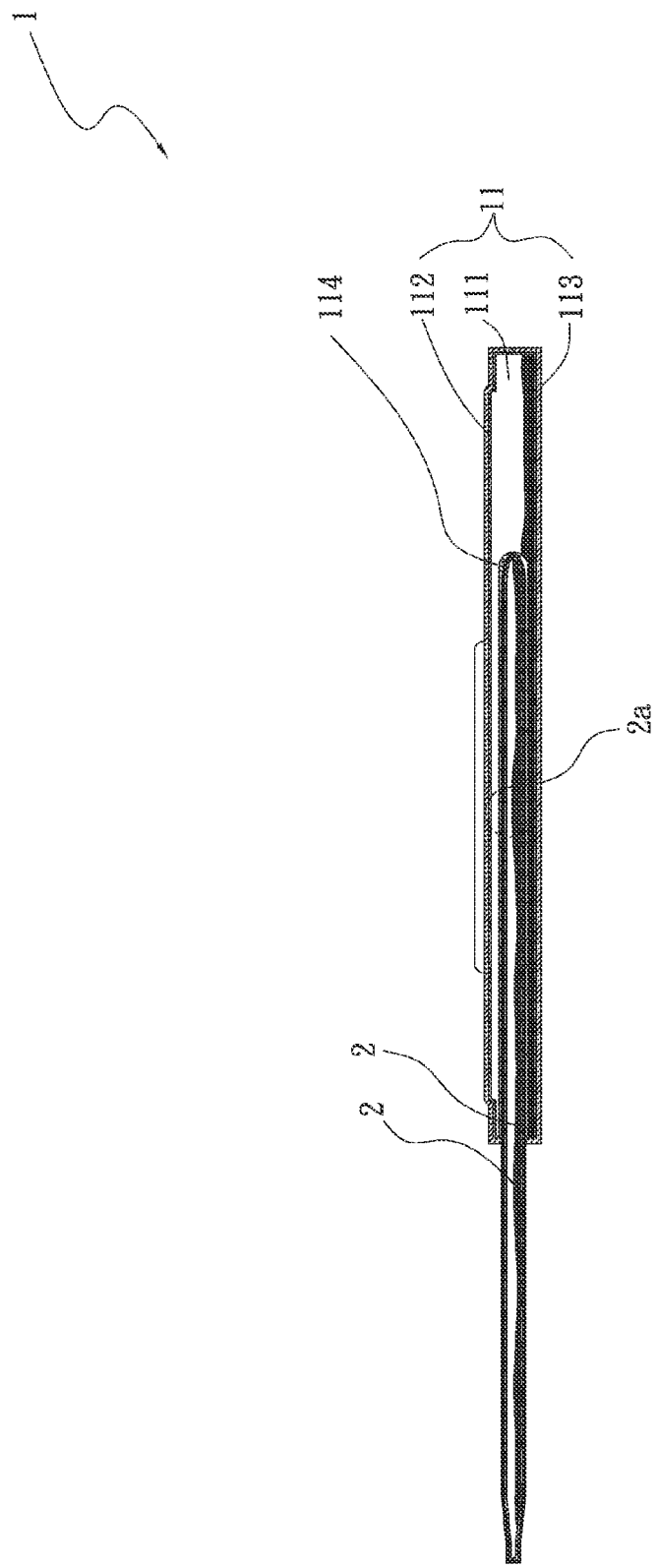
FIG. 2 is a sectional assembled view of the first embodiment of the thermal module of the present invention.
Figure 2A:
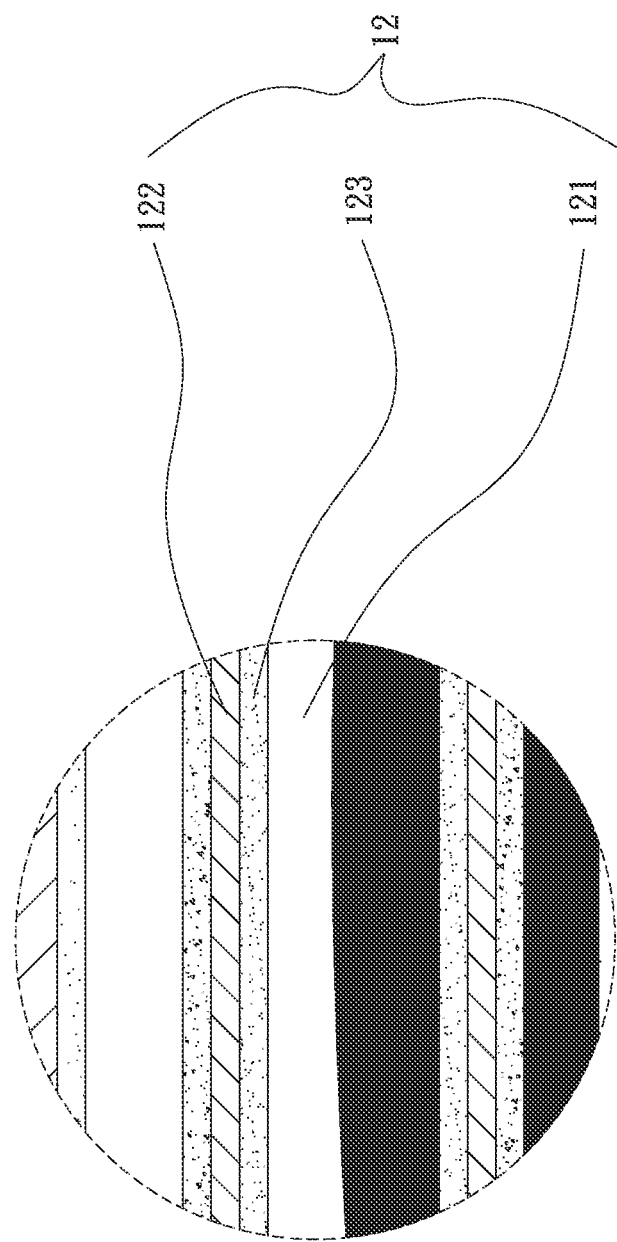
FIG. 2a is an enlarged view of circled area of FIG. 2.

Please refer to FIGS. 1, 2 and 2a. FIG. 1 is a perspective view of a first embodiment of the thermal module of the present invention. FIG. 2 is a sectional assembled view of the first embodiment of the thermal module of the present invention. FIG. 2a is an enlarged view of circled area of FIG. 2. According to the first embodiment, the thermal module 1 of the present invention includes a first heat transfer member 11 and a second heat transfer member 12.

The first heat transfer member 11 has a first chamber 111 in which a first capillary structure 112 is disposed. The second heat transfer member 12 has a second chamber 121 and a conduction section 122. A second capillary structure 123 is disposed in the second chamber 121. The conduction section 122 is received in the first chamber 111. A third capillary structure 114 is disposed on outer surface of the conduction section 122. A working fluid 2 is respectively filled in the first and second chambers 111, 121.

The first heat transfer member 11 has a heat absorption side 113 disposed on one side of the first heat transfer member 11 opposite to the first chamber 111. The heat absorption side 113 can be correspondingly attached to at least one heat source (not shown).

The first heat transfer member 11 is a vapor chamber. The second heat transfer member 12 is a heat pipe. In this embodiment, the conduction section 122 is disposed at a middle section of the second heat transfer member 12 between two ends thereof. The conduction section 122 of the second heat transfer member 12 is received in the first chamber 111 of the first heat transfer member 11. The first and third capillary structures 112, 114 are selected from a group consisting of fiber bodies, sintered powder bodies, channeled structures, hydrophilic coatings and mesh bodies. In this embodiment, the first and third capillary structures 112, 114 are, but not limited to, sintered powder bodies for illustration purposes only. The second capillary structure 123 is also selected from a group consisting of fiber bodies, sintered powder bodies, channeled structures, hydrophilic coatings and mesh bodies. The third capillary structure 114 is partially and/or completely disposed on the outer surface of the conduction section 122.

Figure 3:
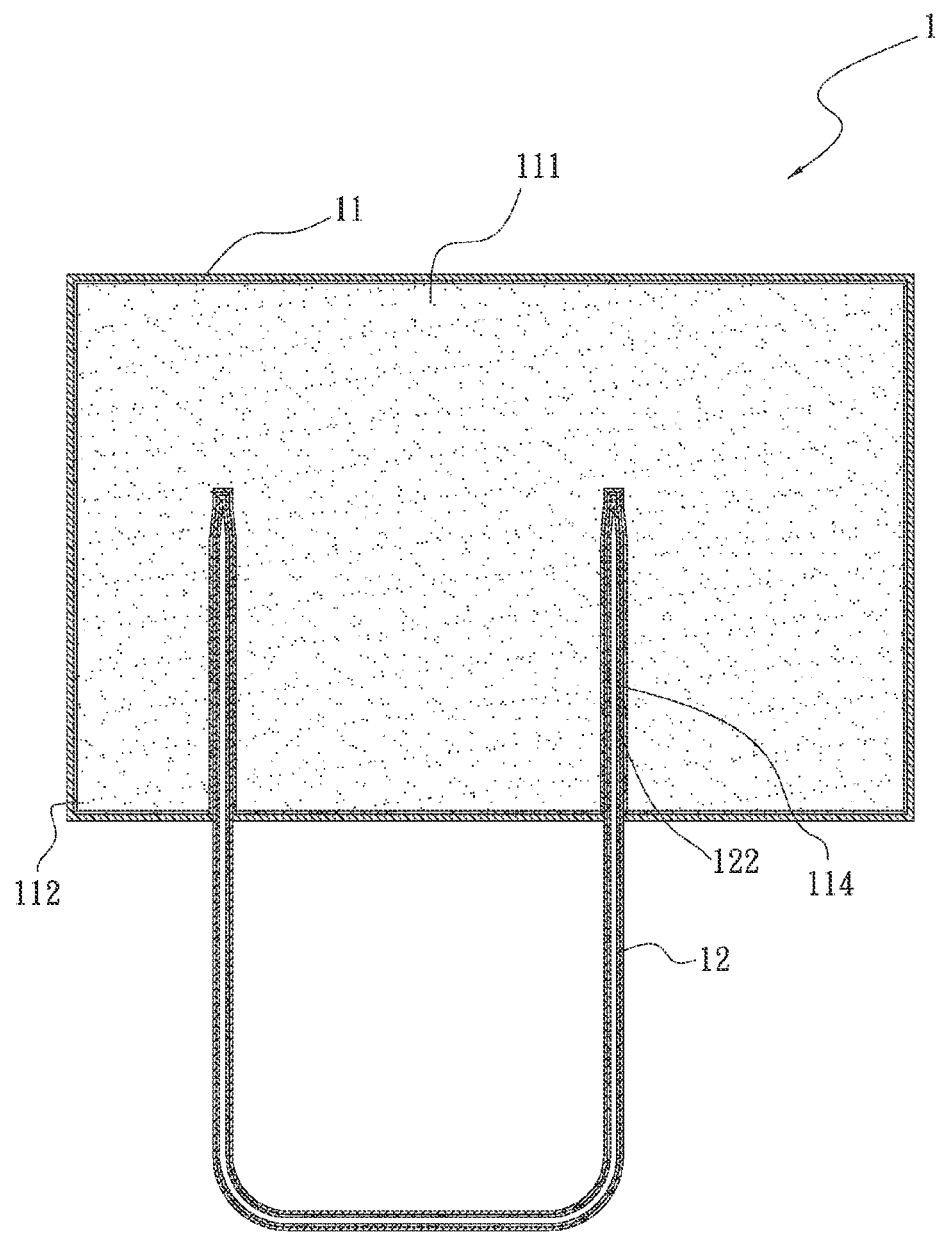
FIG. 3 is a sectional assembled view of a second embodiment of the thermal module of the present invention.

Please now refer to FIG. 3, which is a sectional assembled view of a second embodiment of the thermal module of the present invention. The second embodiment is partially identical to the first embodiment in structure and connection relationship and thus will not be repeatedly described hereinafter. The second embodiment is different from the first embodiment in that the conduction section 122 is disposed at two ends of the second heat transfer member 12. That is, the two ends of the second heat transfer member 12 are inserted in the first chamber 111 of the first heat transfer member 11. The third capillary structure 114 is disposed on outer side of the conduction section 122.

Figure 4:
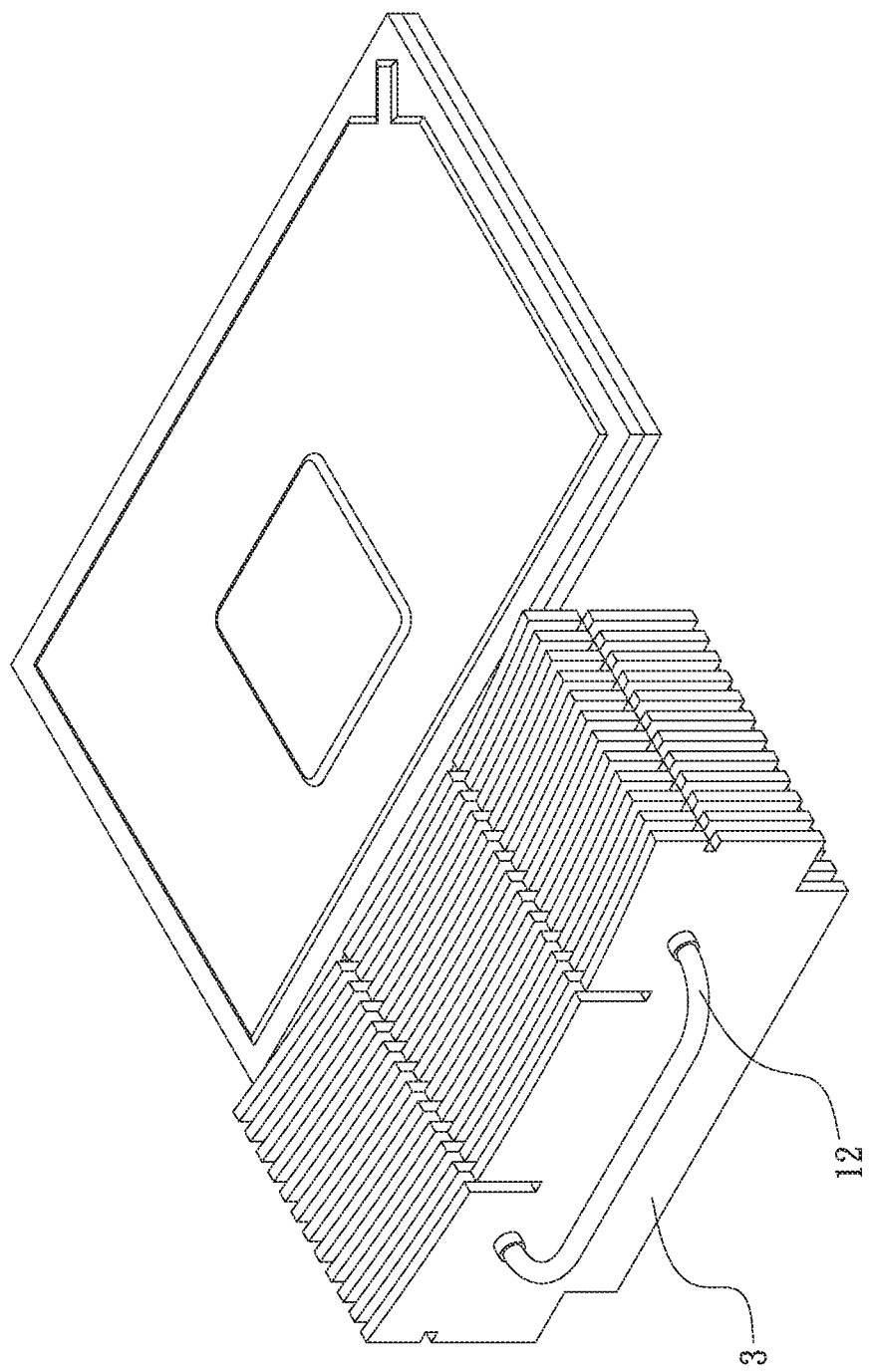
FIG. 4 is a perspective assembled view of a third embodiment of the thermal module of the present invention.

Please now refer to FIG. 4, which is a perspective assembled view of a third embodiment of the thermal module of the present invention. The third embodiment is partially identical to the second embodiment in structure and connection relationship and thus will not be repeatedly described hereinafter. The third embodiment is different from the second embodiment in that the second heat transfer member 12 is further connected with at least one heat dissipation member 3. The heat dissipation member 3 can be a heat sink or a radiating fin assembly. In this embodiment, the heat dissipation member 3 is, but not limited to, a heat sink for illustration purposes only.

Figure 5:
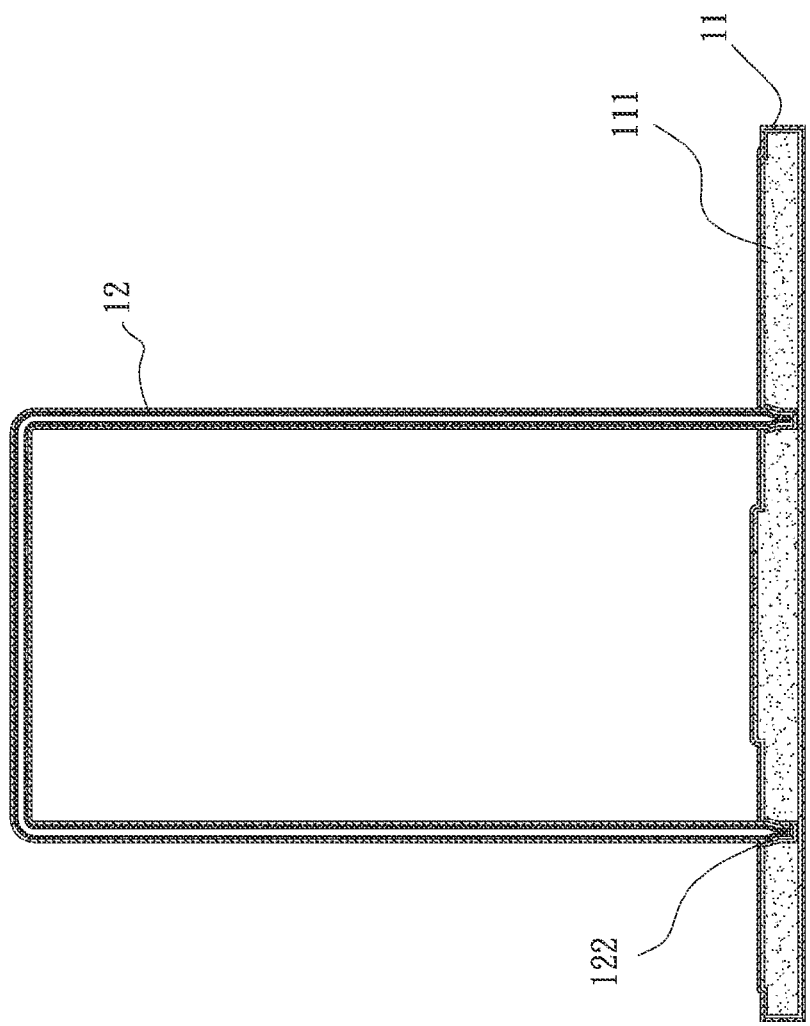
FIG. 5 is a sectional assembled view of a fourth embodiment of the thermal module of the present invention.

Please now refer to FIG. 5, which is a sectional assembled view of a fourth embodiment of the thermal module of the present invention. The fourth embodiment is partially identical to the second embodiment in structure and connection relationship and thus will not be repeatedly described hereinafter. The fourth embodiment is different from the second embodiment in that the conduction section 122 is disposed at two ends of the second heat transfer member 12, which are inserted in the first chamber 111 of the first heat transfer member 11. The first and second heat transfer members 11, 12 are normal to each other.

Figure 6:
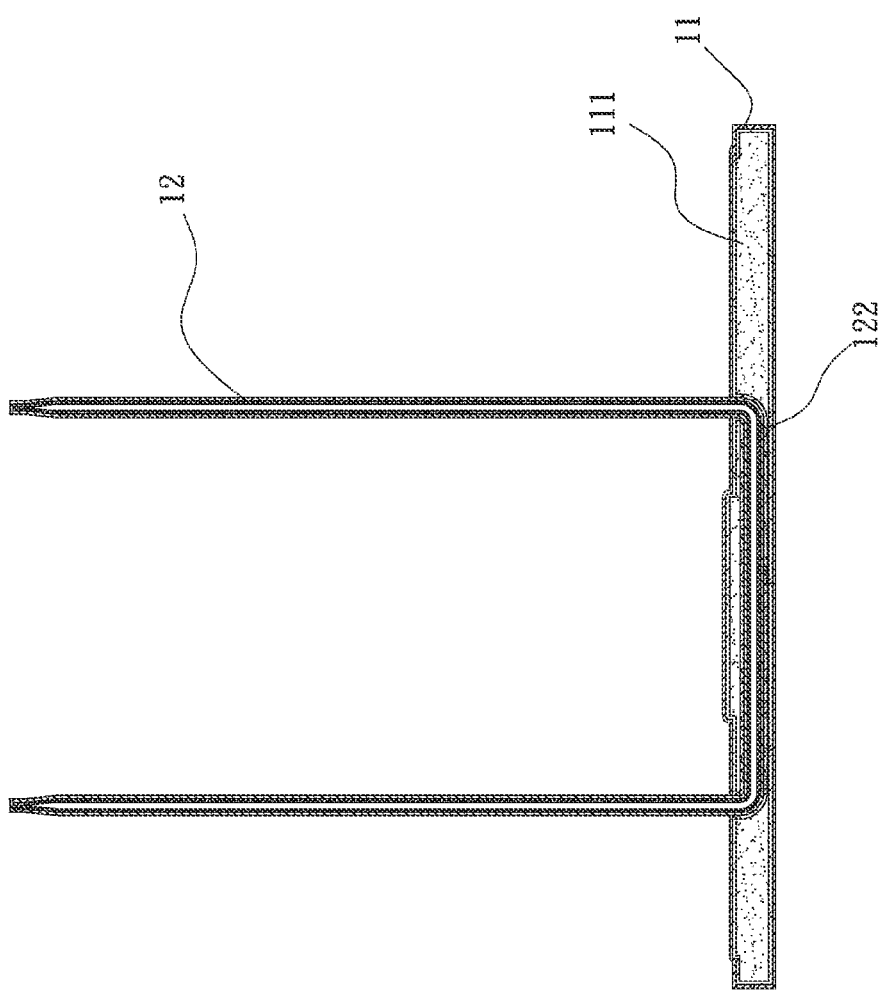
FIG. 6 is a sectional assembled view of a fifth embodiment of the thermal module of the present invention.

Please now refer to FIG. 6, which is a sectional assembled view of a fifth embodiment of the thermal module of the present invention. The fifth embodiment is partially identical to the first embodiment in structure and connection relationship and thus will not be repeatedly described hereinafter. The fifth embodiment is different from the first embodiment in that the conduction section 122 is disposed between two ends of the second heat transfer member 12 and received in the first chamber 111 of the first heat transfer member 11. The first and second heat transfer members 11, 12 are normal to each other. The conduction section 122 can be in contact with the wall face of the first chamber 111 or not in contact with the wall face of the first chamber 111. In this embodiment, the conduction section 122 is, but not limited to, in contact with the wall face of the first chamber 111 for illustration purposes only.

Figure 7:
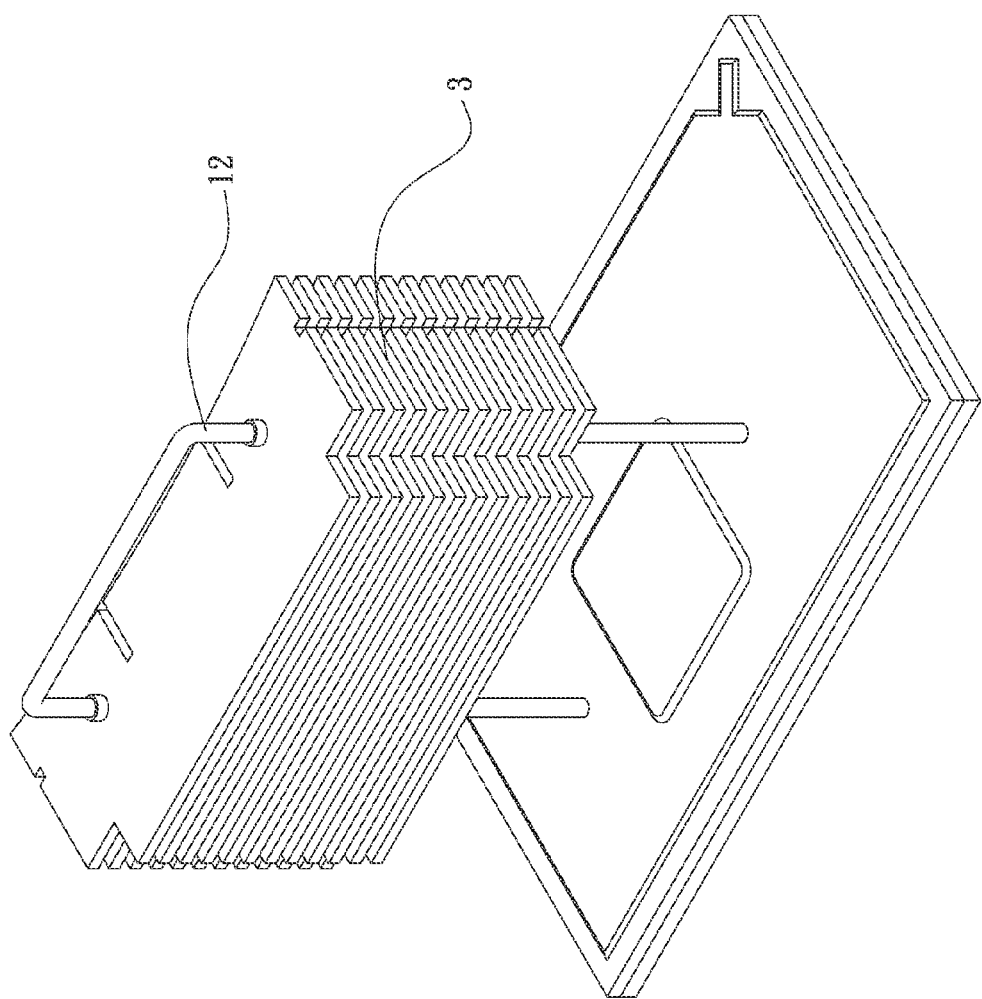
FIG. 7 is a perspective assembled view of a sixth embodiment of the thermal module of the present invention.

Please now refer to FIG. 7, which is a perspective assembled view of a sixth embodiment of the thermal module of the present invention. The sixth embodiment is partially identical to the fourth embodiment in structure and connection relationship and thus will not be repeatedly described hereinafter. The sixth embodiment is different from the fourth embodiment in that the second heat transfer member 12 is further connected with a heat dissipation member 3.

Figure 8:
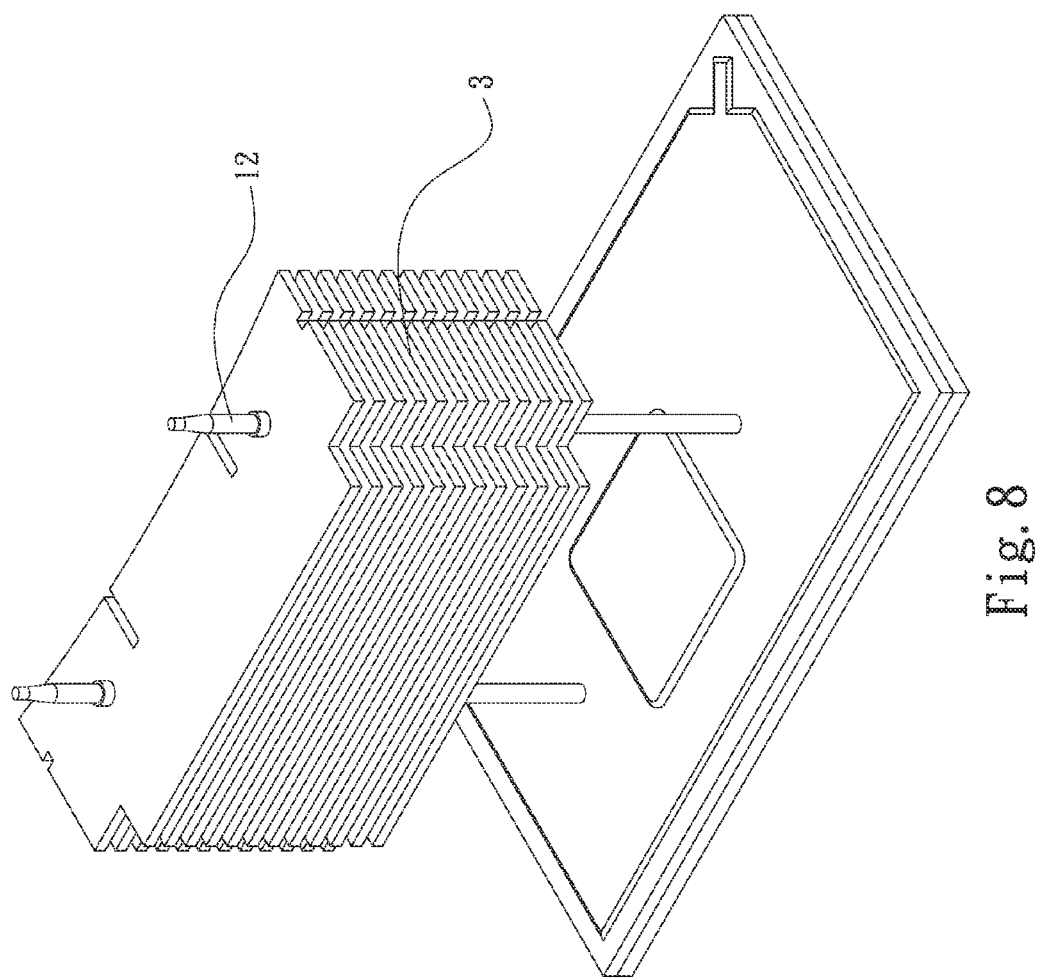
FIG. 8 is a perspective assembled view of a seventh embodiment of the thermal module of the present invention.

Please now refer to FIG. 8, which is a perspective assembled view of a seventh embodiment of the thermal module of the present invention. The seventh embodiment is partially identical to the fifth embodiment in structure and connection relationship and thus will not be repeatedly described hereinafter. The seventh embodiment is different from the fifth embodiment in that the second heat transfer member 12 is further connected with a heat dissipation member 3.

In the first to seventh embodiments, the first capillary structure 112 disposed in the first chamber 111 and the third capillary structure 114 disposed on the conduction section 122 are selected from a group consisting of fiber bodies, sintered powder bodies, channeled structures, hydrophilic coatings and mesh bodies. However, the first and third capillary structures 112, 114 are not limited to be the same kind of capillary structures. Alternatively, each of the first and third capillary structures 112, 114 can be a combination of different kinds of capillary structures.

The present invention has been described with the above embodiments thereof and it is understood that many changes and modifications in the above embodiments can be carried out without departing from the scope and the spirit of the invention that is intended to be limited only by the appended claims.

What is claimed is:
1. A thermal module comprising:
a first heat transfer member being a vapor chamber and having a first chamber in which a first capillary structure is disposed on an inner wall; and
a second heat transfer member being a heat pipe and having a U-shape and a second chamber and a conduction section formed by or disposed between free ends of the U-shape wherein said conduction section of said second heat transfer member is inserted in the first chamber of the first heat transfer member, the second chamber and the first chamber being not communicable with each other, a second capillary structure being disposed in the second chamber, the conduction section being received in the first chamber, a third capillary structure being fixed on an outer surface of the second heat transfer member and extending beyond the conduction section itself and including the conduction section being in contact with the first capillary structure on the inner wall of the first chamber, wherein the third capillary structure remains fixed on the outer surface of the second heat transfer member, and the first capillary structure is different from the third capillary structure, a working fluid being respectively filled in the first and second chambers and isolated; and
wherein the first capillary structure disposed on the inner wall of the first chamber and the third capillary structure attached to the outer surface of the second heat transfer member itself are selected from a group consisting of fiber bodies, sintered powder bodies, channeled structures, hydrophilic coatings and mesh bodies, each of the first and third capillary structures being the same kind of capillary structure or a combination of different kinds of capillary structures.

2. The thermal module as claimed in claim 1, wherein the first heat transfer member has a heat absorption side disposed on one side of the first heat transfer member opposite to the first chamber.

3. The thermal module as claimed in claim 1, wherein the conduction section is disposed at two ends of the second heat transfer member.

4. The thermal module as claimed in claim 1, wherein the conduction section is disposed between two ends of the second heat transfer member.

5. The thermal module as claimed in claim 1, further comprising a heat dissipation member, the heat dissipation member being connected with the second heat transfer member, the heat dissipation member being a heat sink or a radiating fin assembly.

6. The thermal module as claimed in claim 1, wherein the conduction section is disposed at two ends of the second heat transfer member and inserted in the first chamber of the first heat transfer member, the first and second heat transfer members being perpendicular to each other.

7. The thermal module as claimed in claim 1, wherein the conduction section is disposed between two ends of the second heat transfer member and received in the first chamber of the first heat transfer member, the first and second heat transfer members being normal to each other.

8. The thermal module as claimed in claim 1, wherein the third capillary structure is partially or completely disposed on the outer surface of the conduction section.

\* \* \* \* \*